United States Patent
Tien et al.

(10) Patent No.: US 11,972,975 B2
(45) Date of Patent: Apr. 30, 2024

(54) SEMICONDUCTOR DEVICE STRUCTURE HAVING AIR GAP AND METHOD FOR FORMING THE SAME

(71) Applicant: Taiwan Semiconductor Manufacturing Company, Ltd., Hsinchu (TW)

(72) Inventors: Hsi-Wen Tien, Xinfeng Township, Hsinchu County (TW); Wei-Hao Liao, Taichung (TW); Yu-Teng Dai, New Taipei (TW); Hsin-Chieh Yao, Hsinchu (TW); Chih-Wei Lu, Hsinchu (TW); Chung-Ju Lee, Hsinchu (TW); Shau-Lin Shue, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 289 days.

(21) Appl. No.: 17/356,959

(22) Filed: Jun. 24, 2021

(65) Prior Publication Data
US 2022/0415704 A1 Dec. 29, 2022

(51) Int. Cl.
*H01L 21/768* (2006.01)
*H01L 21/033* (2006.01)
*H01L 23/522* (2006.01)
*H01L 23/528* (2006.01)
*H01L 23/532* (2006.01)

(52) U.S. Cl.
CPC ...... *H01L 21/7682* (2013.01); *H01L 21/0332* (2013.01); *H01L 21/0337* (2013.01); *H01L 21/76831* (2013.01); *H01L 21/76832* (2013.01); *H01L 23/5226* (2013.01); *H01L 23/5283* (2013.01); *H01L 23/53295* (2013.01)

(58) Field of Classification Search
CPC ............... H01L 21/7682; H01L 21/764; H01L 21/76834; H01L 21/76831; H01L 23/5226; H01L 23/53295; H01L 23/5329; H01L 23/528; H01L 23/5283
See application file for complete search history.

(56) References Cited

U.S. PATENT DOCUMENTS

| 6,265,321 | B1 * | 7/2001 | Chooi | H01L 21/7682 438/740 |
| 10,665,546 | B1 * | 5/2020 | Lin | H01L 21/76826 |
| 2013/0323930 | A1 * | 12/2013 | Chattopadhyay | H01L 21/76829 156/345.26 |
| 2016/0093566 | A1 * | 3/2016 | Ting | H01L 21/76808 438/643 |

(Continued)

*Primary Examiner* — Jaehwan Oh
*Assistant Examiner* — John M Parker
(74) *Attorney, Agent, or Firm* — Birch, Stewart, Kolasch & Birch, LLP

(57) ABSTRACT

A method of forming a semiconductor device structure is provided. The method includes forming a masking structure with first openings over a semiconductor substrate and correspondingly forming metal layers in the first openings. The method also includes recessing the masking structure to form second openings between the metal layers and forming a sacrificial layer surrounded by a first liner in each of the second openings. In addition, after forming a second liner over the sacrificial layer in each of the second openings, the method includes removing the sacrificial layer in each of the second openings to form a plurality of air gaps therefrom.

20 Claims, 12 Drawing Sheets

(56) References Cited

U.S. PATENT DOCUMENTS

| | | | |
|---|---|---|---|
| 2019/0237356 A1* | 8/2019 | Srivastava | H01L 23/5226 |
| 2020/0185264 A1* | 6/2020 | Lin | H01L 21/7682 |
| 2021/0193566 A1* | 6/2021 | Lo | H01L 23/5384 |
| 2022/0319990 A1* | 10/2022 | Huang | H01L 21/76831 |

* cited by examiner

SEMICONDUCTOR DEVICE STRUCTURE HAVING AIR GAP AND METHOD FOR FORMING THE SAME

BACKGROUND

The semiconductor integrated circuit (IC) industry has experienced rapid growth. Advances in semiconductor manufacturing processes have resulted in semiconductor devices with finer features and/or higher degrees of integration. This scaling-down process generally provides benefits by increasing production efficiency and lowering associated costs.

When the semiconductor industry has progressed into nanometer technology process nodes in pursuit of higher device density, damascene processes are frequently employed for the formation of the interconnect structure including vertical features (e.g., metal vias) and horizontal features (e.g., metal lines). In such damascene processes, low dielectric constant (low-k) materials are typically adopted to act as interlayer dielectric layers (ILDs) and/or inter-metal dielectric layers (IMDs), thereby reducing parasitic effects of line to line capacitance in the interconnect structure.

Although existing damascene processes have generally been adequate for their intended purposes, they have not been entirely satisfactory in all respects, especially as device scaling-down continues. For example, it is a challenge to an interconnect structure with reduced parasitic capacitance at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1:
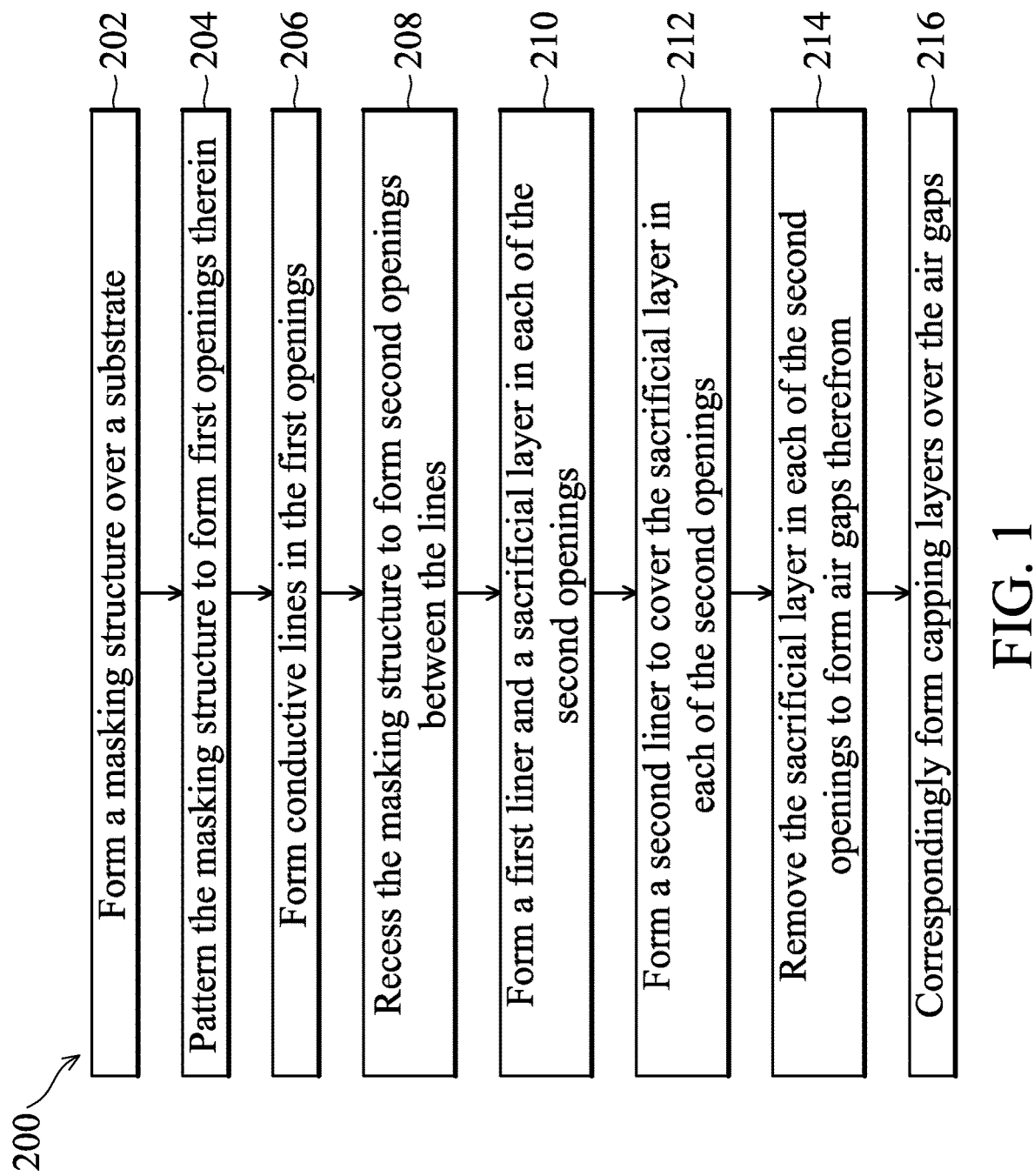
FIG. 1 is a flowchart of a method of manufacturing a semiconductor device in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

FIG. 1 is a flowchart of a method 200 of manufacturing a semiconductor device in accordance with some embodiments. The method 200 is merely an example and is not intended to limit the present disclosure beyond what is explicitly recited in the claims. Additional operations can be provided before, during, and after the method 200, and some operations described can be replaced, eliminated, or moved around for additional embodiments of the method. FIGS. 2 to 12 are cross-sectional views of a semiconductor device structure at various fabrication stages in accordance with some embodiments of the method 200 of FIG. 1. It is understood that FIGS. 2 to 12 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Figure 2:
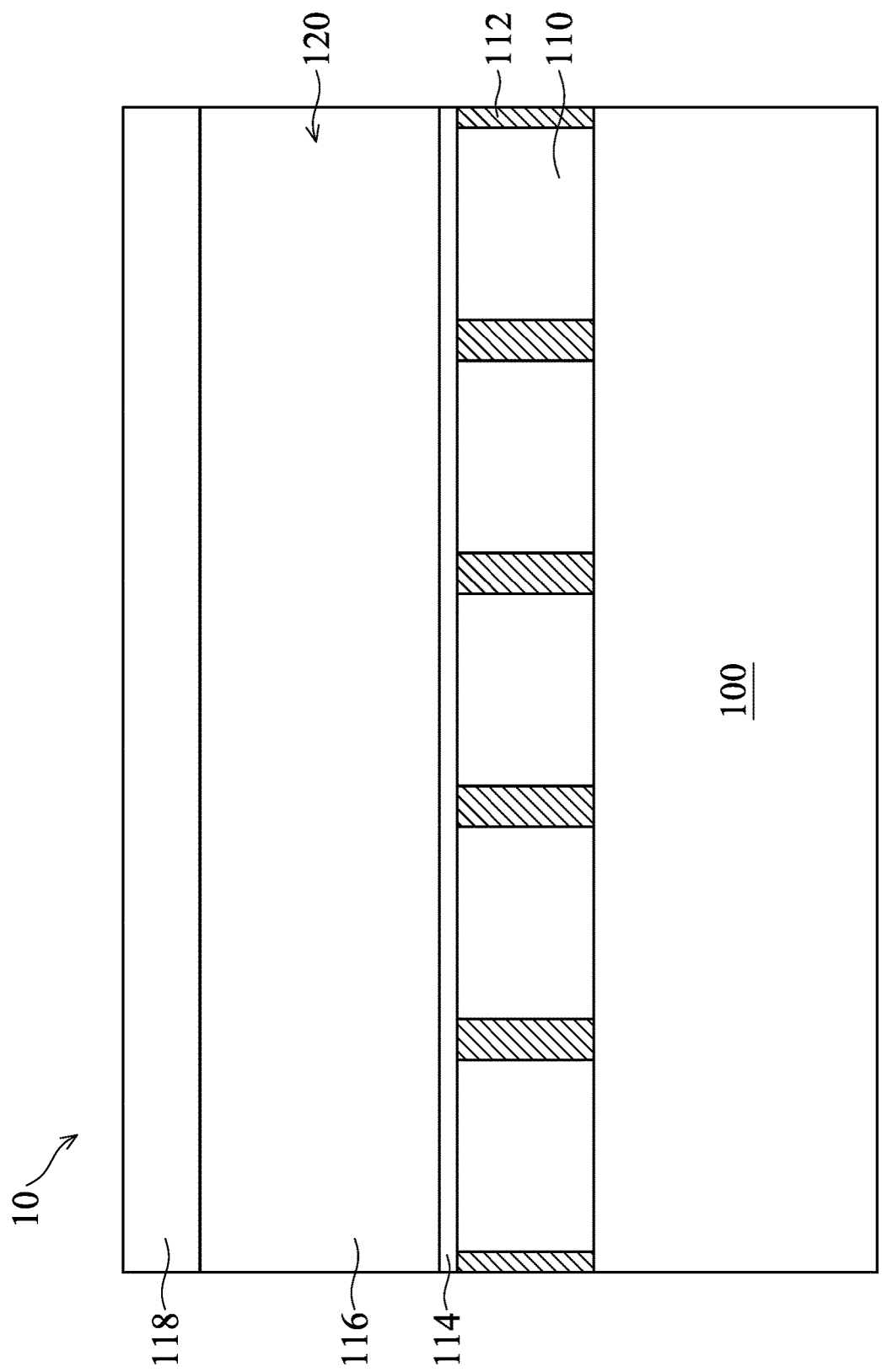
FIGS. 2-12 illustrate cross-sectional representations of various stages of manufacturing a semiconductor device structure in accordance with some embodiments.

In operation 202 of the method 200, referring to FIGS. 1 and 2, a masking structure 120 formed over a semiconductor device 10 is provided, in accordance with some embodiments. The semiconductor device 10 The semiconductor device 10 may be an integrated circuit (IC) chip, system-on-chip (SOC), or portion thereof. The semiconductor device 10 includes a substrate 100. In some embodiments, the substrate 100 is a bulk semiconductor substrate, such as a semiconductor wafer. The substrate 100 may include silicon or another elementary semiconductor material such as germanium. For example, the substrate 100 is a silicon wafer. In some other embodiments, the substrate 100 includes a compound semiconductor. The compound semiconductor may include silicon germanium, gallium arsenide, silicon carbide, indium arsenide, indium phosphide, another suitable compound semiconductor, or a combination thereof.

In some embodiments, the substrate 100 includes a semiconductor-on-insulator (SOI) substrate. The SOI substrate may be fabricated using a wafer bonding process, a silicon film transfer process, a separation by implantation of oxygen (SIMOX) process, another applicable method, or a combination thereof.

In some embodiments, various device elements are formed in and/or over the substrate 100. The device elements are not shown in figures for the purpose of simplicity and clarity. Examples of the various device elements include transistors, diodes, another suitable element, or a combination thereof. For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 100. The isolation features are used to define active regions and electrically isolate various device elements formed in and/or over the substrate 100 in the active regions. In some embodiments, the isolation features include shallow trench isolation (STI) features, local oxidation of silicon (LOCOS) features, other suitable isolation features, or a combination thereof.

In some embodiments, an interconnect structure (which will be described in more detail later) is formed over the substrate 100. The interconnect structure includes multiple dielectric layers containing an interlayer dielectric (ILD) layer and one or more inter-metal dielectric (IMD) layers. The interconnect structure also includes multiple conductive features formed in the ILD and IMD layers. The conductive features may include conductive lines, conductive vias, and/or conductive contacts. Various processes, such as back-end-of-line (BEOL) semiconductor fabrication processes, are performed to form the interconnect structure.

In some embodiments, an insulating layer 110 is formed over the substrate 100 prior to the formation of the masking structure 120. The insulating layer 110 may serve as an ILD or IMD layer of an interconnect structure. The insulating layer 110 covers device elements formed in and/or over the substrate 100. Although FIG. 2 shows that the insulating layer 110 is a single layer, embodiments of the disclosure are not limited thereto. In some other embodiments, the insulating layer 110 is a multi-layer structure including dielectric sub-layers.

In some embodiments, the insulating layer 110 is made of or includes a low dielectric constant (low-k) material, an extreme low-k (ELK) material, silicon oxide, silicon oxynitride, borosilicate glass (BSG), phosphoric silicate glass (PSG), borophosphosilicate glass (BPSG), fluorinated silicate glass (FSG), one or more other suitable materials, or a combination thereof. The insulating layer 110 may be formed by a chemical vapor deposition (CVD) process, an atomic layer deposition (ALD) process, a spin-on process, one or more other applicable processes, or a combination thereof.

In some embodiments, after the insulating layer 110 is formed, a patterning process, a damascene deposition process, and a planarization process are successively performed on the insulating layer 110 to form conductive vias 112 in the insulating layer 110, as shown in FIG. 2. Those conductive vias 112 may be electrically connected to various device elements are formed in and/or over the substrate 100.

More specifically, the patterning process is performed on the insulating layer 110 to form via openings therein, in accordance with some embodiments. The patterning process may include forming a patterned photoresist layer (not shown) using a lithography process or another suitable process. Examples of such a lithography process include spin-coating, soft-baking, exposure, post-baking, developing, rinsing, drying, and other suitable processes. The patterning process may also include an etching process using the patterned photoresist layer as a mask to etch via openings in the dielectric layer 100.

Afterwards, the damascene deposition process is performed to form a conductive material in the via openings. The conductive material may be additionally disposed above and on the insulating layer 110. In some embodiments, the conductive material includes a metal material, such as copper, copper alloy, tungsten, titanium, titanium nitride, or combinations thereof. The damascene deposition process may include a CVD process, an ALD process, a spin-on process, an electroplating process (ECP), an electroless deposition (ELD) process, one or more other applicable processes, or a combination thereof. A planarization process (e.g., a chemical mechanical polishing (CMP) process a dry polishing process, a grinding process, an etching process, one or more other applicable processes, or a combination thereof) is subsequently performed, so that the top of the conductive material is substantially level with the top of the insulating layer 110. As a result of the damascene deposition process and the subsequent planarization process, conductive vias 112 (which are also referred to as metal vias) are formed in the insulating layer 110.

After the conductive vias 112 are formed, the masking structure 112 including a stack of a first layer 114, a second layer 116 and a third layer 116 is formed over the insulating layer 110, in accordance with some embodiments. More specifically, the formation of the masking structure 112 includes depositing the first layer 114 (which is also referred to as the bottom layer or the first masking layer) over the insulating layer 110, in accordance with some embodiments. The first layer 114 covers the conductive vias 112. The first layer 1, 14 is used as a protective layer to prevent the conductive vias 112 from being damaged during subsequent etching processes. The first layer 114 may be made of or include an insulating material, such as silicon carbide (SiC), silicon dioxide (SiO$_2$), silicon nitride (SiN), silicon carbonitride (SiCN), silicon oxynitride (SiON), SiOC, SiOCN, or another suitable material. The first layer 114 may be formed using a CVD process, an ALD process, a spin-on process, one or more other applicable processes, or a combination thereof.

The formation of the masking structure 112 also includes depositing the second layer 116 (which is also referred to as a middle layer or a second masking layer) to cover the first layer 114, in accordance with some embodiments. The second layer 116 is used for definition of conductive layers/lines in subsequent etch and deposition processes. The second layer has a thickness greater than the first layer 114 and is based on the desired thickness of the subsequently formed conductive layers/lines. In some embodiments, the thickness of the second layer 116 is greater than or substantially equal to the desired thickness of the subsequently formed conductive layers/lines. For example, the thickness of the second layer 116 is in a range from about 30 Å to about 500 Å. The etching rate of the second layer 116 is different from that of the first layer 114, so that the first layer 114 serves as an etching stop layer for the second layer 116 in subsequent etching process. The second layer 116 may be made of or include a metal-containing material or a dielectric material dielectric material. For example, the second layer 116 may be made of or include TiN, TiO, W, HfO, ZrO, ZnO, TiZrO, SiC, $SiO_2$, SiOC, SiN, SiCN, SiOCN, $AlO_x$, or AlON. The second layer 116 may be formed using a CVD process, an ALD process, a spin-on process, one or more other applicable processes, or a combination thereof.

The formation of the masking structure 112 further includes depositing the third layer 118 (which is also referred to as a top layer or a third masking layer) to cover the second layer 116, in accordance with some embodiments. The third layer 118 is used as a hard mask layer during patterning the second layer 116. The etching rate of the second layer 116 is also different from that of the third layer 118, so that the second layer 116 serves as an etching stop layer for the third layer 118 in subsequent etching process. The third layer 118 may be made of or include a dielectric material that is the same as or different from a dielectric material of the first layer 114. For example, third layer 118 may be made of or include an insulating material, such as SiC, $SiO_2$, SiN, SiCN, SiON, SiOC, SiOCN, or another suitable material. The third layer 118 may be formed using a CVD process, an ALD process, a spin-on process, one or more other applicable processes, or a combination thereof.

Figure 3:
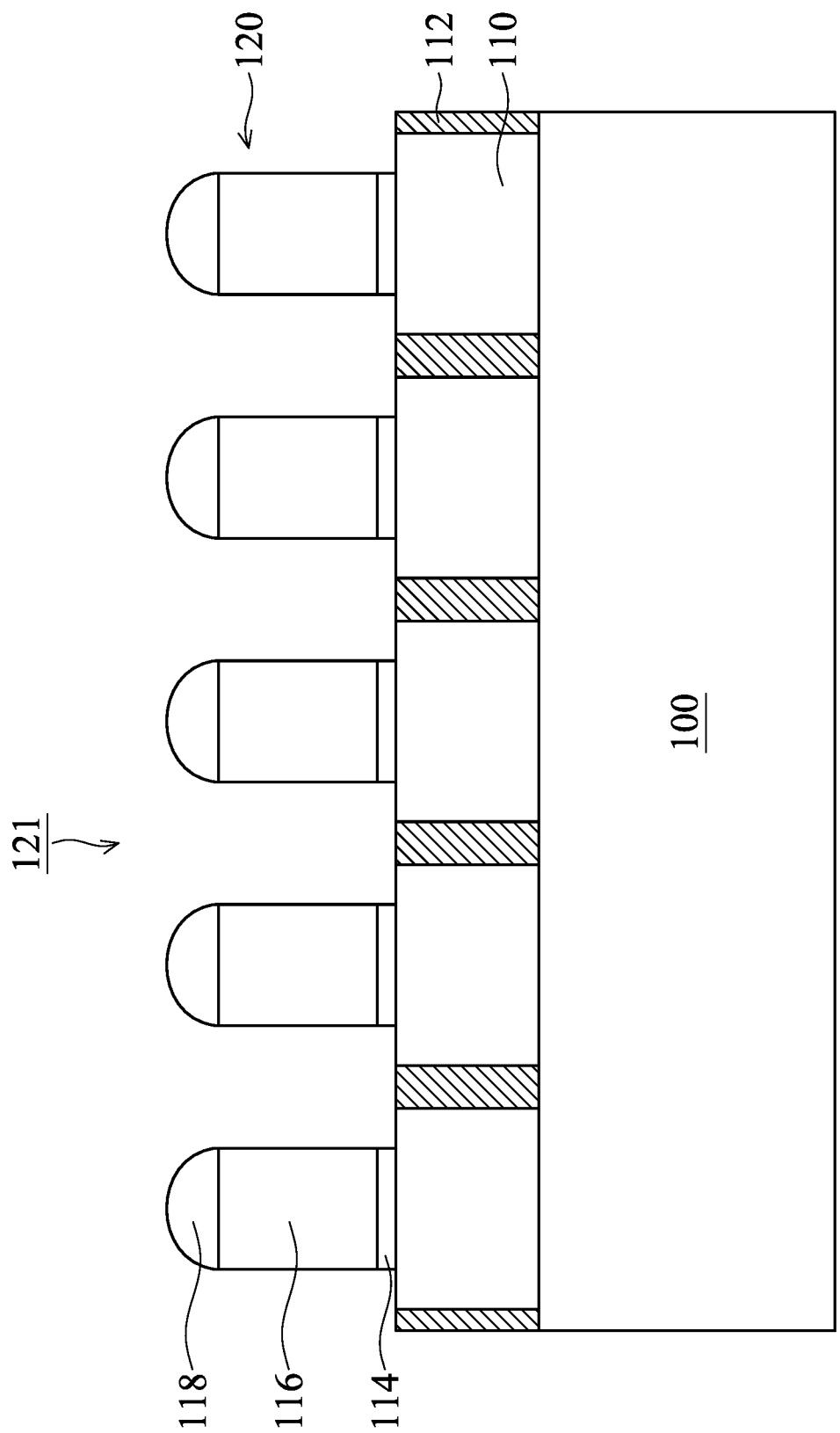

In operation 204 of the method 200, referring to FIGS. 1 and 3, the masking structure 120 is patterned to form first openings 121, in accordance with some embodiments. More specifically, a patterning process is performed on the insulating layer 110 to form the first openings 121 therein, in accordance with some embodiments. The first openings 121 are used for the placement of the conductive lines/layers in the subsequent processes, and therefore the first openings 121 is also referred to as trench openings. The patterning process may include forming a patterned photoresist layer (not shown) using a lithography process or another suitable process. The patterning process may also include one or more etching processes using the patterned photoresist layer as a mask to etch first openings 121 in the masking structure 120. The first openings 121 are correspondingly aligned to and expose the underlying conductive vias 112 formed in the insulating layer 110, as shown in FIG. 3 in accordance with some embodiments. In some embodiments, the first opening 121 has a critical dimension (CD) that is in a range from about 5 nm to about 3000 nm. Moreover, the angle between the upper surface of the insulating layer 110 and the sidewall of the first opening 121 is in a range from about 50 degrees to about 95 degrees.

In some embodiments, the etching process is a dry etching process or a wet etching process. For example, the etching process may be a dry etching process (e.g., a reactive ion etching (RIE) process) using an inductively-coupled plasma (ICP) processing system or a capacitively-coupled plasma (CCP) processing system. In those cases, the dry etching process may be performed using an etching gas including $CH_4$, $CH_3F$, $CH_2F_2$, $CH_3F$, $CF_4$, $C_4F_6$, $C_4F$, $H_2$, HBr, CO, $CO_2$, $O_2$, $BCl_3$, $Cl_2$, $SiCl_4$, $N_2$, He, Ne, Ar, or a combination thereof. The dry etching process may be performed at a temperature that is not greater than about 100 degrees C. The dry etching process may be performed at a pressure that is in a range from about 0.2 mTorr to about 50 mTorr. The operation radio frequency (RF) power for the dry etching process may be in a range from about 50 W to about 3000 W. The bias voltage for the dry etching process may be in a range from about 0 V to about 1200 V.

Figure 4:
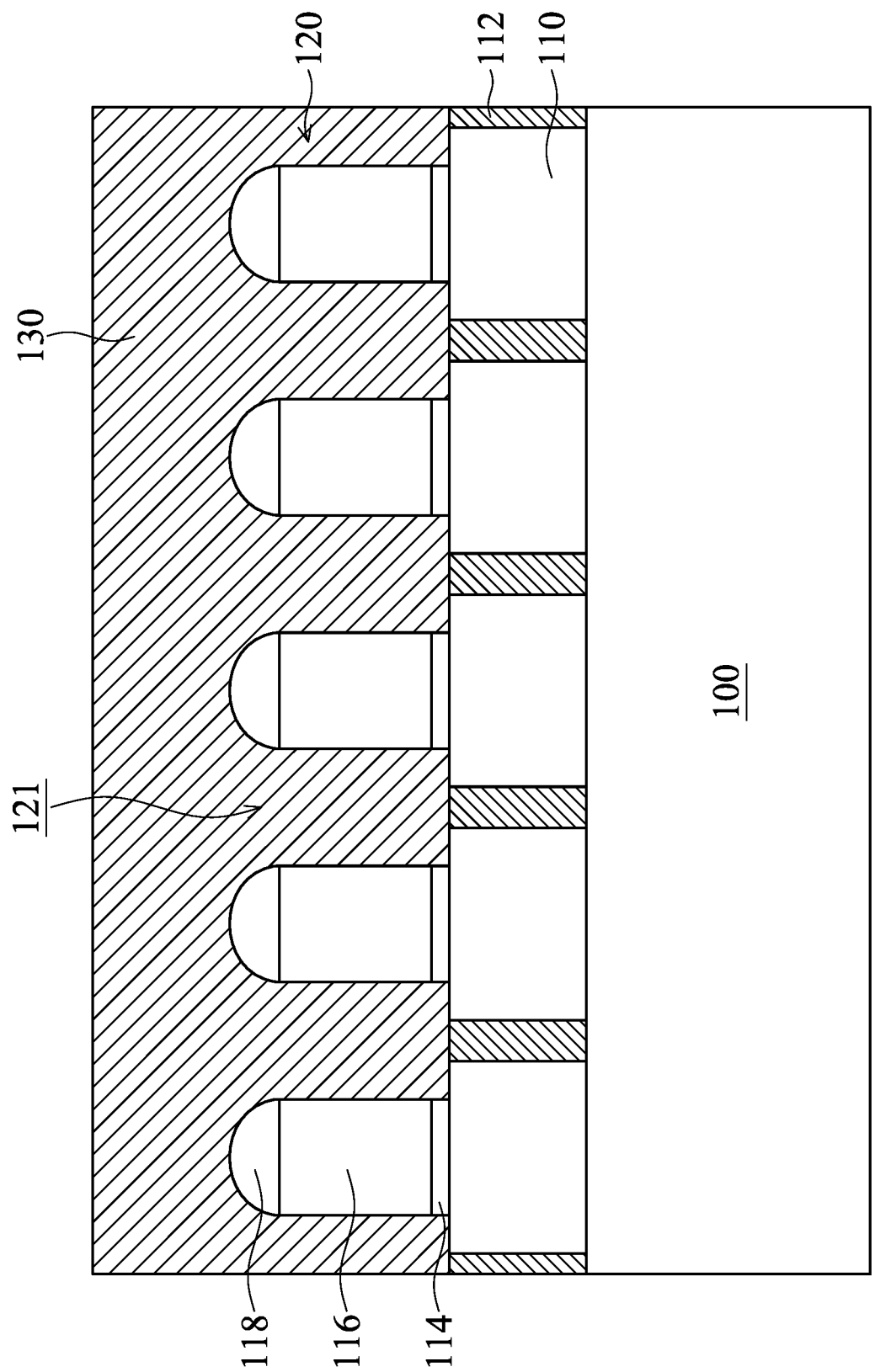
Figure 5:
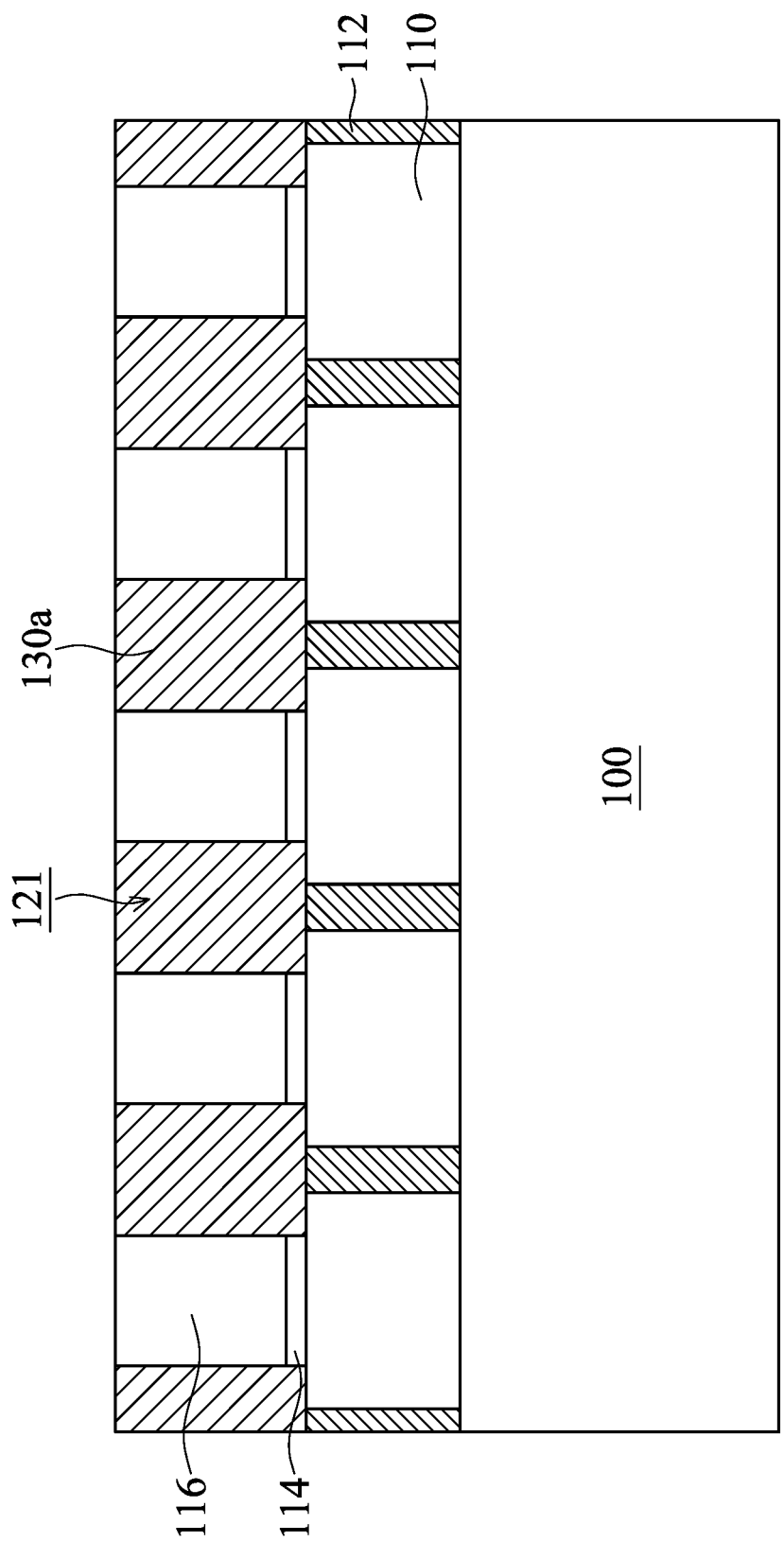

In operation 206 of the method 200, referring to FIGS. 1, 4 and 5, conductive lines/layers 130a are respectively formed in the first openings 121 of the masking structure 120, in accordance with some embodiments. More specifically, a damascene deposition process is performed to form a conductive material 130 in the trench openings (i.e., the first openings 121). The conductive material 130 may be additionally disposed above and on the third layer 118 of the masking structure 120. In some embodiments, the conductive material 130 includes a metal material (such as Cu, Mo, Ir, W, or a combination thereof). The damascene deposition process may include a CVD process, an ALD process, a spin-on process, an electroplating process (ECP), an electroless deposition (ELD) process, a physical vapor deposition (PVD) process, one or more other applicable processes, or a combination thereof.

In some other embodiments, an optional barrier material layer (not shown) is deposited over the masking layer 120 and fills the first openings 121 prior to the formation of the conductive material 130. In some embodiments, the barrier material layer is formed as a liner and is in direct contact with the masking structure 120 and the conductive vias 112. In some embodiments, the thickness of the barrier material layer is in a range from about 1 Å to about 10 Å. The range is only an example and is not a limitation to the disclosure.

In some embodiments, the barrier material layer is made of or includes a conductive material (such as Ta, TaN, TiN, Ti, Ru, or Co, or a combination thereof). In some embodiments, the barrier material layer is conformally deposited using an ALD process, a PVD process, a CVD process, one or more other applicable processes, or a combination thereof.

In some embodiments, a planarization process (e.g., a CMP process, a dry polishing process, a grinding process, an etching process, one or more other applicable processes, or a combination thereof) is subsequently performed to remove the third layer 118 from the masking structure 120 and the excess conductive material 130 above the second layer 116 of the masking structure 120. As a result, the top of the remaining conductive material 130 is substantially level with the top of the exposed second layer 116 of the masking structure 120, as shown in FIG. 5. As a result of the damascene deposition process and the subsequent planarization process, the remaining conductive material 130 forms a conductive line/layer 130a (which are also referred to as metal line/layer) in each of the first openings 121 in the masking structure 120, to correspondingly electrically connect the underlying conductive vias 112.

Figure 6:
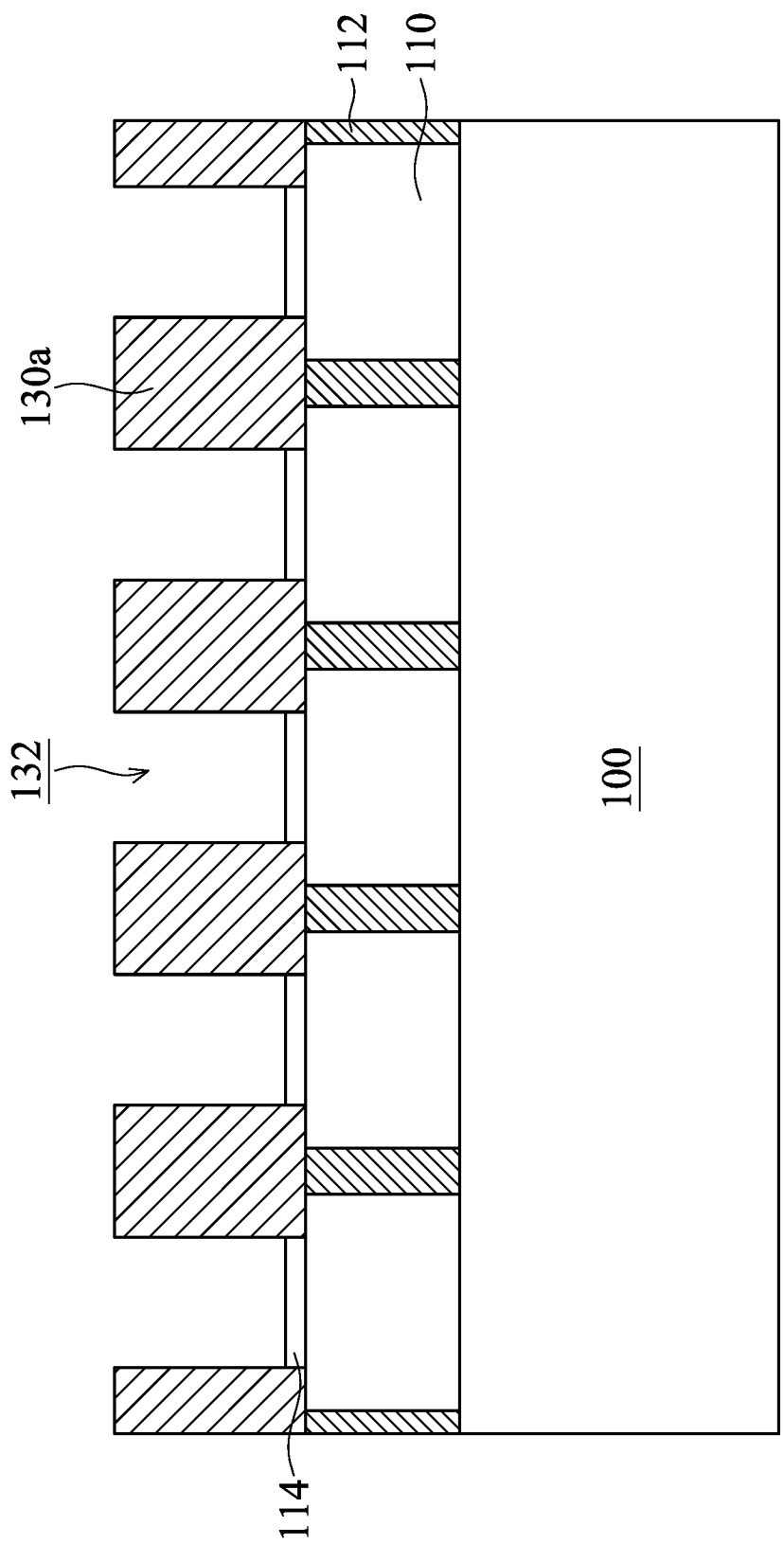

In operation 208 of the method 200, referring to FIGS. 1 and 6, the masking structure 120 is recessed to form second openings 132 between the conductive lines/layers 130a, in accordance with some embodiments. In some embodiments, the masking structure 120 is recessed by removing the second layer 116 (shown in FIG. 5) from the masking structure 120 to correspondingly expose the first layer 114 of the masking structure 120. As a result, second openings 132 are formed between the conductive line/layer 130a and above the first layer 114 of the masking structure 120, as shown in FIG. 6.

The second layer 116 may be removed in an etching process, such as a dry etching process or a wet etching process. For example, the second layer 116 may be removed in a dry etching process (e.g., an RIE process) using an ICP processing system or a CCP processing system. In those cases, the dry etching process may be performed using an etching gas including $CH_4$, $CH_3F$, $CH_2F_2$, $CH_3F$, $CF_4$, $C_4F_6$, $C_4FR$, $H_2$, HBr, CO, $CO_2$, $O_2$, $BCl_3$, $Cl_2$, $SiCl_4$, $N_2$, He, Ne, Ar, or a combination thereof. The dry etching process may be performed at a temperature that is not greater than about 100 degrees C. and at a pressure that is in a range from about 0.2 mTorr to about 50 mTorr.

Figure 7:
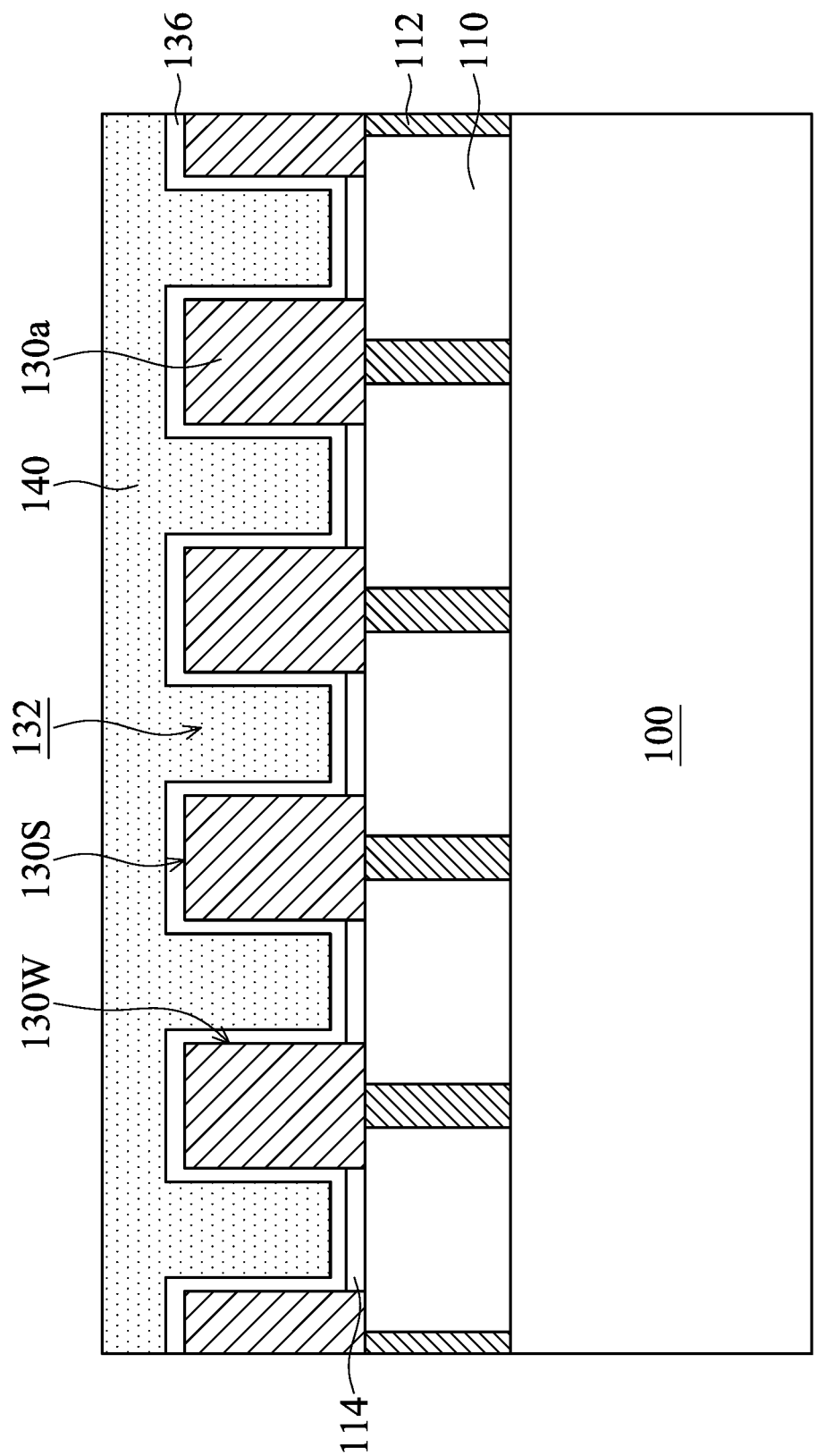
Figure 8:
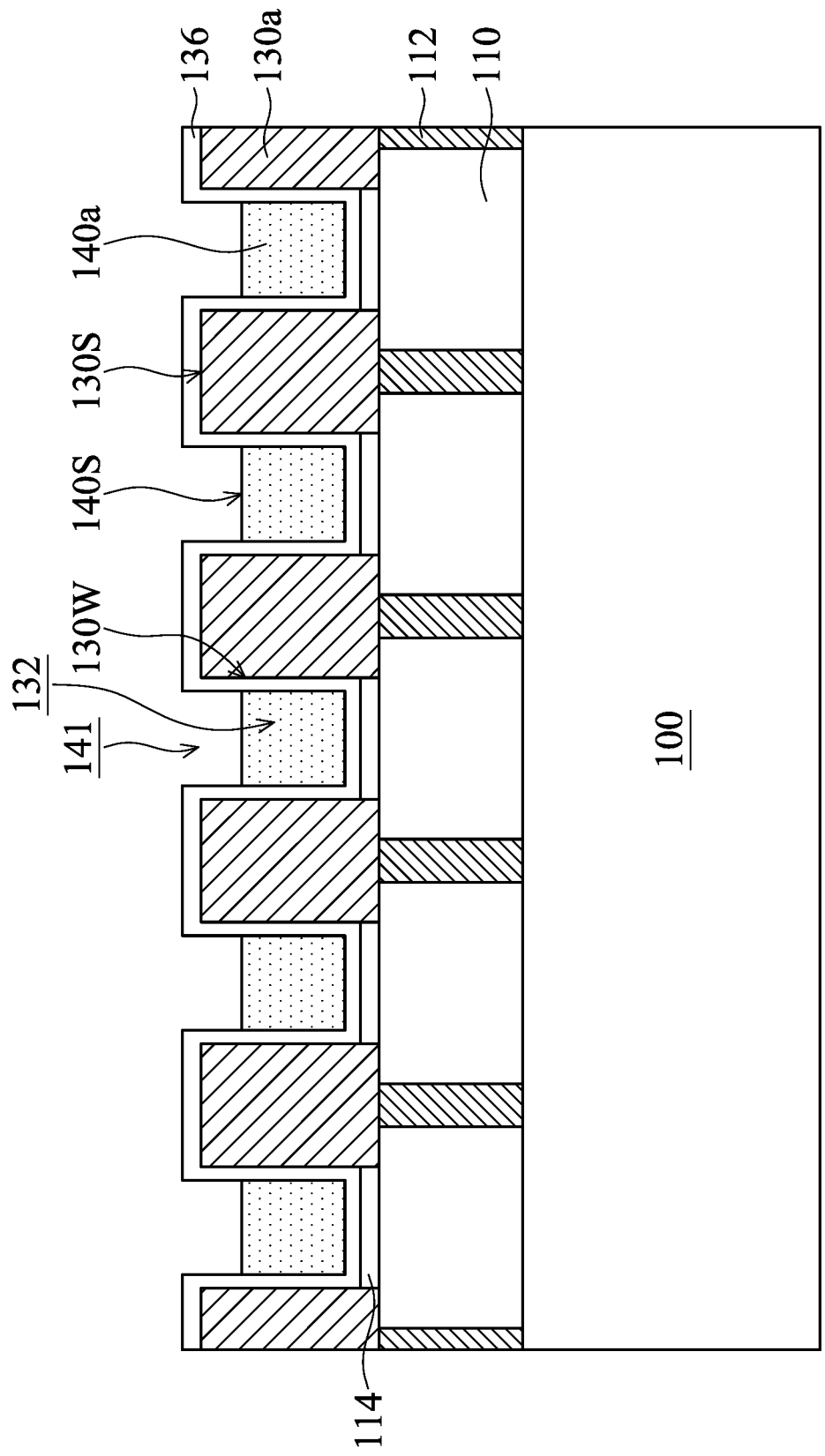

In operation 210 of the method 200, referring to FIGS. 1, 7 and 8, a first liner 136 and a sacrificial layer 140a are successively formed in each of the second openings 132, in accordance with some embodiments. In some embodiments, the first liner 136 is deposited on the conductive lines/layers 130a and fills the space formed by the removal of the second layer 118 (i.e., the second openings 132). The first liner 136 conformally covers the sidewalls and bottom of each second opening 132 and is in direct contact with the sidewalls 130W and upper surfaces 130S of the conductive lines/layers 130a.

In some embodiments, the first liner 136 is used as a protective layer to prevent the conductive lines/layers 130a from damaged during the subsequent etching processes. Therefore, the first liner 136 is also referred as a protective liner. In some embodiments, the first liner 136 is made of or includes an insulating material, such as SiC, $SiO_2$, SiN, SiCN, SiON, SiOC, SiOCN, or another suitable material. The first liner 136 may be conformally deposited using an ALD process, a PVD process, a CVD process, one or more other applicable processes, or a combination thereof.

After the first liner 136 (i.e., the protective liner) is conformally formed over the structure shown in FIG. 6, a damascene deposition process is subsequently performed to form a sacrificial material 140 over the first liner 136 and fills the second openings 132, as shown in FIG. 7 in accordance with some embodiments. The sacrificial material 140 may be additionally disposed above and in direct contact with the first liner 136. In some embodiments, the damascene deposition process is a thermal decomposable material deposition process, so that a thermal removable material (i.e., the sacrificial material 140) is formed above and in direct contact with the first liner 136 and fills the second openings 132.

In some embodiments, the thermal decomposable material includes an organic compound, a silicon-based $C_xH_y$ compound, or a heat depolymerized material. For example, the thermal decomposable material may be a heat depolymerized material. The heat depolymerized material layer may include a organic polymer. Such a polymer can be depolymerized by heat. Sometimes such a heat depolymerized material is also referred to as an ashless carbon (ALC) layer. The sacrificial material 140 may be formed by a plasma deposition process, such as a CVD process, a PVD process, an ALD process, a spin-on process, or another applicable process.

In some other embodiments, the sacrificial material 140 uses an energy removal material. The energy removal material is a material decomposable upon being exposed to proper energy such as ultraviolet (UV), X-ray, infrared, visual light, electron-beam (e-beam), and/or other proper energy sources. For example, the energy removal material includes a photonic decomposable material or an c-beam decomposable material.

After the sacrificial material 140 is formed, the sacrificial material 140 is recessed by an etch back process or another suitable process to form the sacrificial layer 140a in each of the second openings 132, as shown in FIG. 8 in accordance with some embodiments. More specifically, the sacrificial material 140 is recessed until the top of the remained sacrificial material 140 is lower than the upper surface 130S of the conductive lines/layers 130a. As a result, the remained sacrificial material 140 forms sacrificial layers 140a in the second openings 132, respectively. Moreover, the sacrificial layers 140a have an upper surface 140S that is lower than the upper surface 130S of the conductive lines/layers 130a, so that third openings 141 are formed above the corresponding sacrificial layers 140a.

Each of the sacrificial layers 140a has sidewalls and a bottom that are surrounded by the first liner 136, so that each of the conductive lines/layers 130a and each of the first layers 114 is separated from the corresponding sacrificial layer 140a by the first liner 136. Since the conductive lines/layers 130a are separated from the sacrificial material 140 by the first liner 136, the first liner 136 provides a protection for the conductive lines/layers 130a to avoid the damage of the conductive lines/layers 130a being damaged due to the etch back process for the sacrificial material 140.

In some embodiments, the sacrificial material 140 that is made of the heat depolymerized material is recessed by a dry etching process. In some embodiments, the dry etching process is an RIE process using an ICP processing system, a CCP processing system, and/or a remote plasma source. In those cases, the dry etching process may be performed using an etching gas including $CH_4$, $CH_3F$, $CH_2F_2$, $CH_3F$, $CF_4$, $C_4F_6$, $C_4F_8$, $H_2$, HBr, CO, $CO_2$, $O_2$, $BCl_3$, $Cl_2$, $SiCl_4$, $N_2$, He, Ne, Ar, or a combination thereof. The dry etching process may be performed at a temperature that is not greater than about 100 degrees C. The dry etching process may be performed at a pressure that is in a range from about 0.2 mTorr to about 50 mTorr. The operation RF power for the dry etching process may be in a range from about 50 W to about 3000 W. The bias voltage for the dry etching process may be in a range from about 0 V to about 1200 V.

In some other embodiments, the sacrificial material 140 that is made of the heat depolymerized material is recessed by an annealing process or an ashing process.

Figure 9:
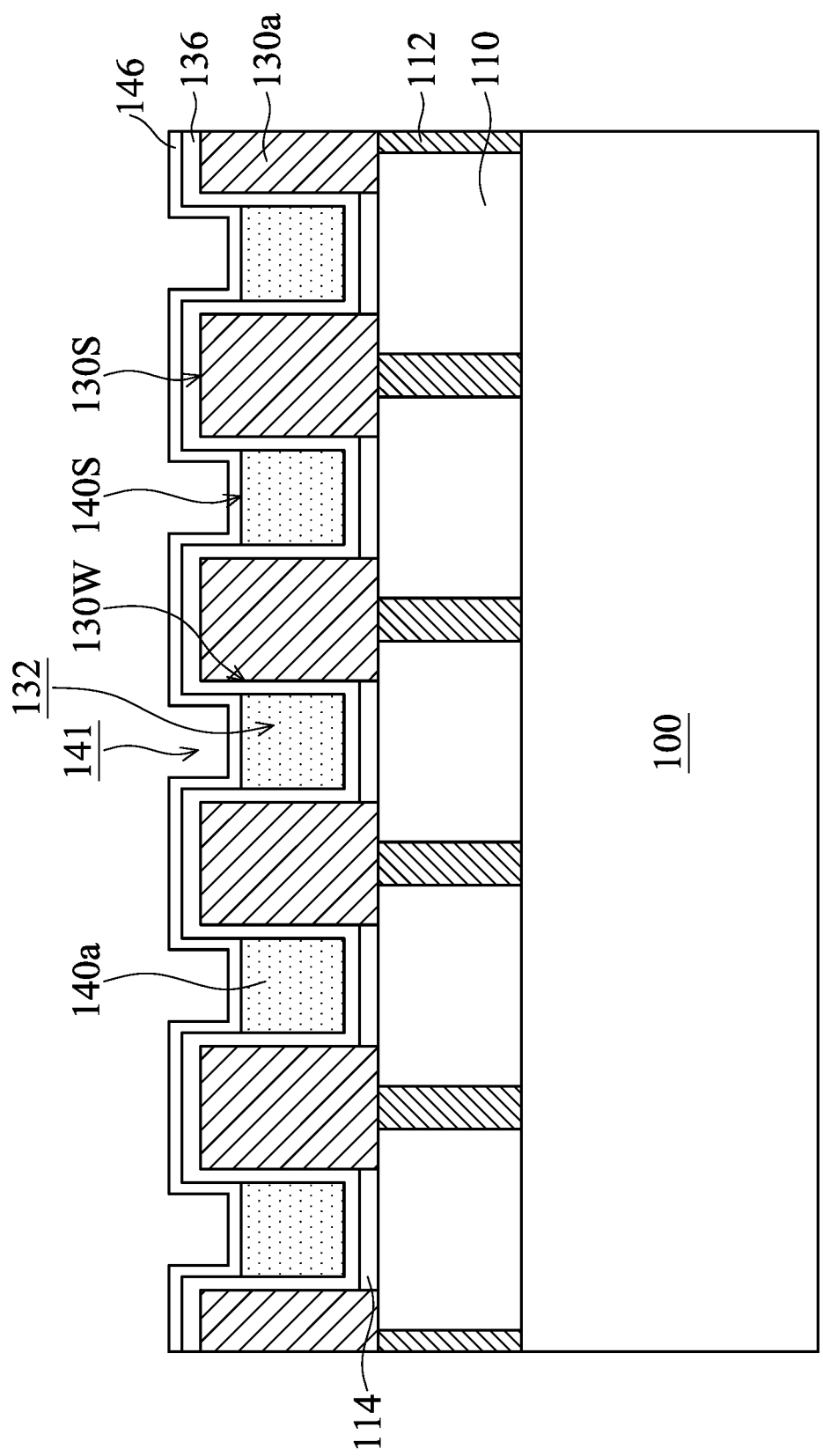

In operation 212 of the method 200, referring to FIGS. 1 and 9, a second liner 146 is formed in each of the third openings 132, in accordance with some embodiments. In some embodiments, the second liner 146 is deposited above the conductive lines/layers 130a and fills the space formed by recessing of the sacrificial material 140 (i.e., the third openings 141). The formed second liner 146 conformally covers the sidewalls and bottom of each third opening 141. Moreover, the formed second liner 146 is in direct contact with the upper surface 140S of each sacrificial layer 140a and a portion of the first liner 136 extending above each sacrificial layer 140a and covering the upper surfaces 130S of the conductive lines/layers 130a. Therefore, the second liner 146 is separated from the conductive lines/layers 130a by the first liner 136.

In some embodiments, the second liner 146 covers the sacrificial layers 140a to serve as a cap for the subsequently formed air gaps. Therefore, the second liner 146 is also referred as a capping liner. In some embodiments, the second liner 146 is made of or includes an insulating material that is the same as or different than that of the first liner 136. For example, the second liner 146 may be made of or include SiC, $SiO_2$, SiN, SiCN, SiON. SiOC, SiOCN, or another suitable material. The second liner 146 may be conformally deposited using an ALD process, a PVD process, a CVD process, one or more other applicable processes, or a combination thereof.

Figure 10:
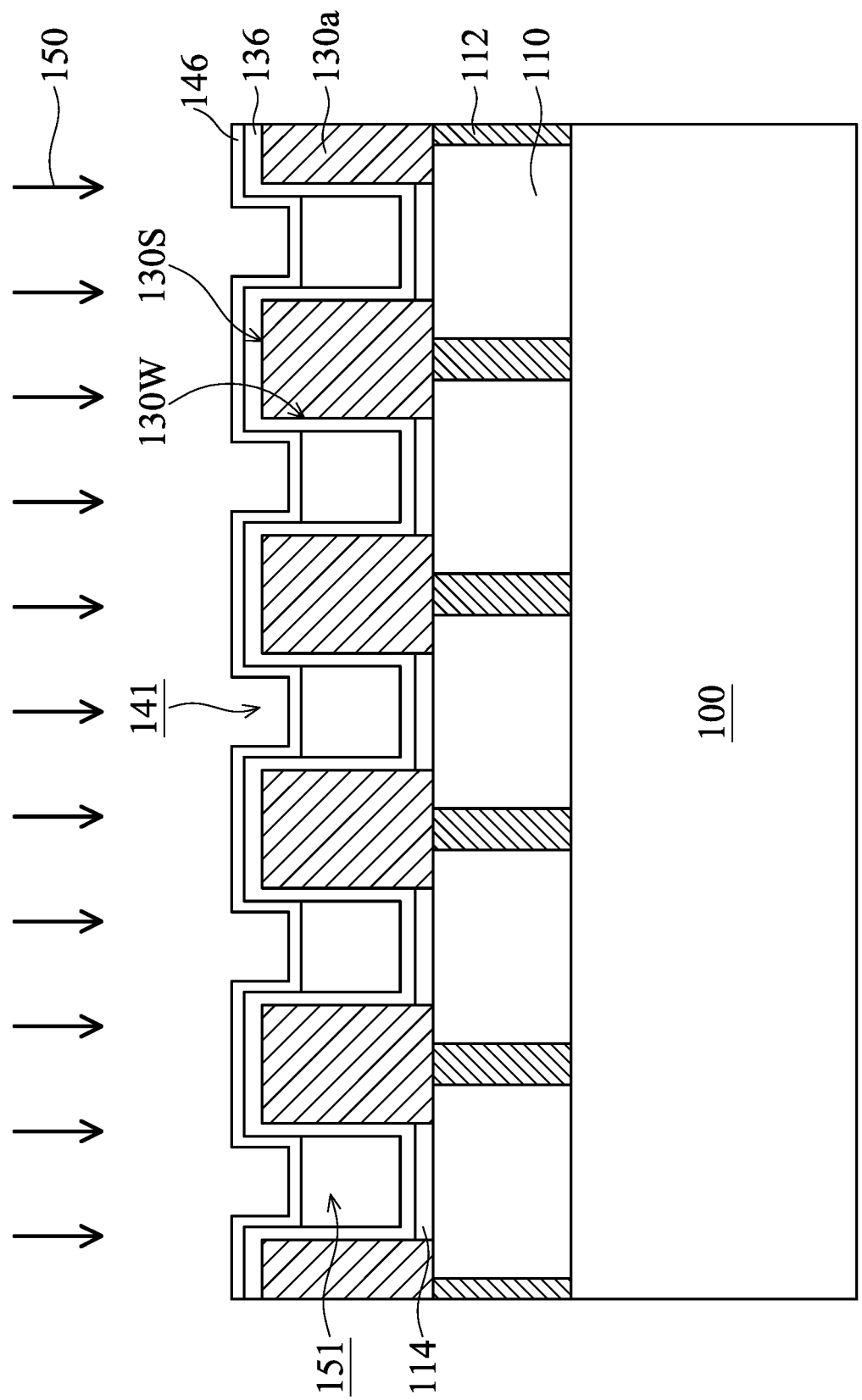

In operation 214 of the method 200, referring to FIGS. 1 and 10, the sacrificial layers 140a formed in the second openings 132 (indicated in FIG. 9) and covered by the second liner 146 are removed to form air gaps 151, in accordance with some embodiments. In some embodiments, a thermal process 150 using thermal energy is performed on the structure shown in FIG. 9 to remove the sacrificial layers 140a. As a result, air gaps 151 are formed in the spaces formed by the removal of the sacrificial layers 140a. That is, the air gaps 151 are substantially formed in the region formerly occupied by the sacrificial layers 140a. The formed air gaps 151 and the metal lines/layers 130a are alternately arranged over the insulating layer 110, so that opposite sidewalls 130W of each of the metal lines/layers 130a are adjacent to two air gaps 151, respectively. Each of the air gaps 151 has sidewalls and a bottom, which are covered by the first liner 136, so that the first layers 114 and the overlying first liners 136 separate the insulating layer 110 from the air gaps 151.

Figure 11:
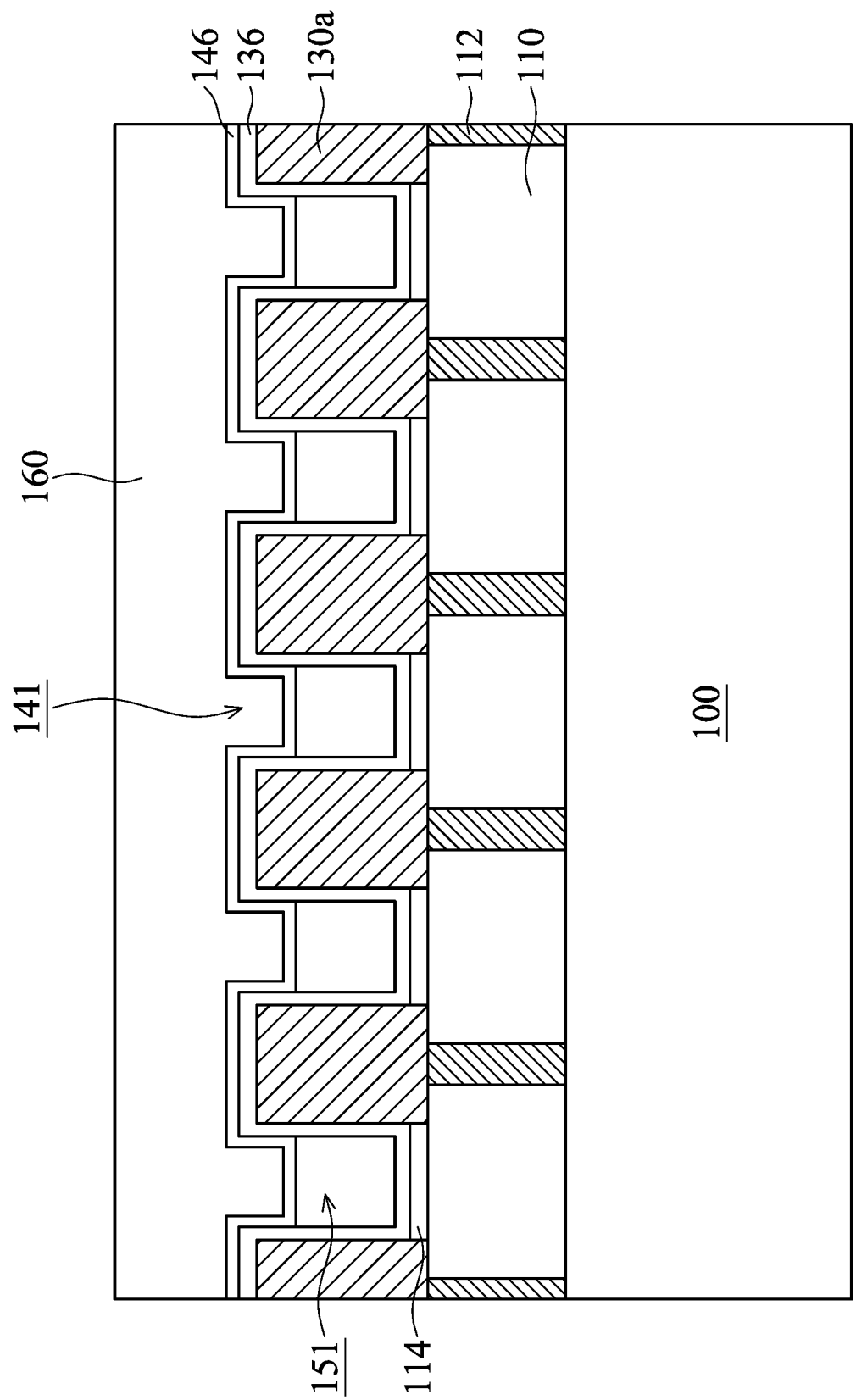
Figure 12:
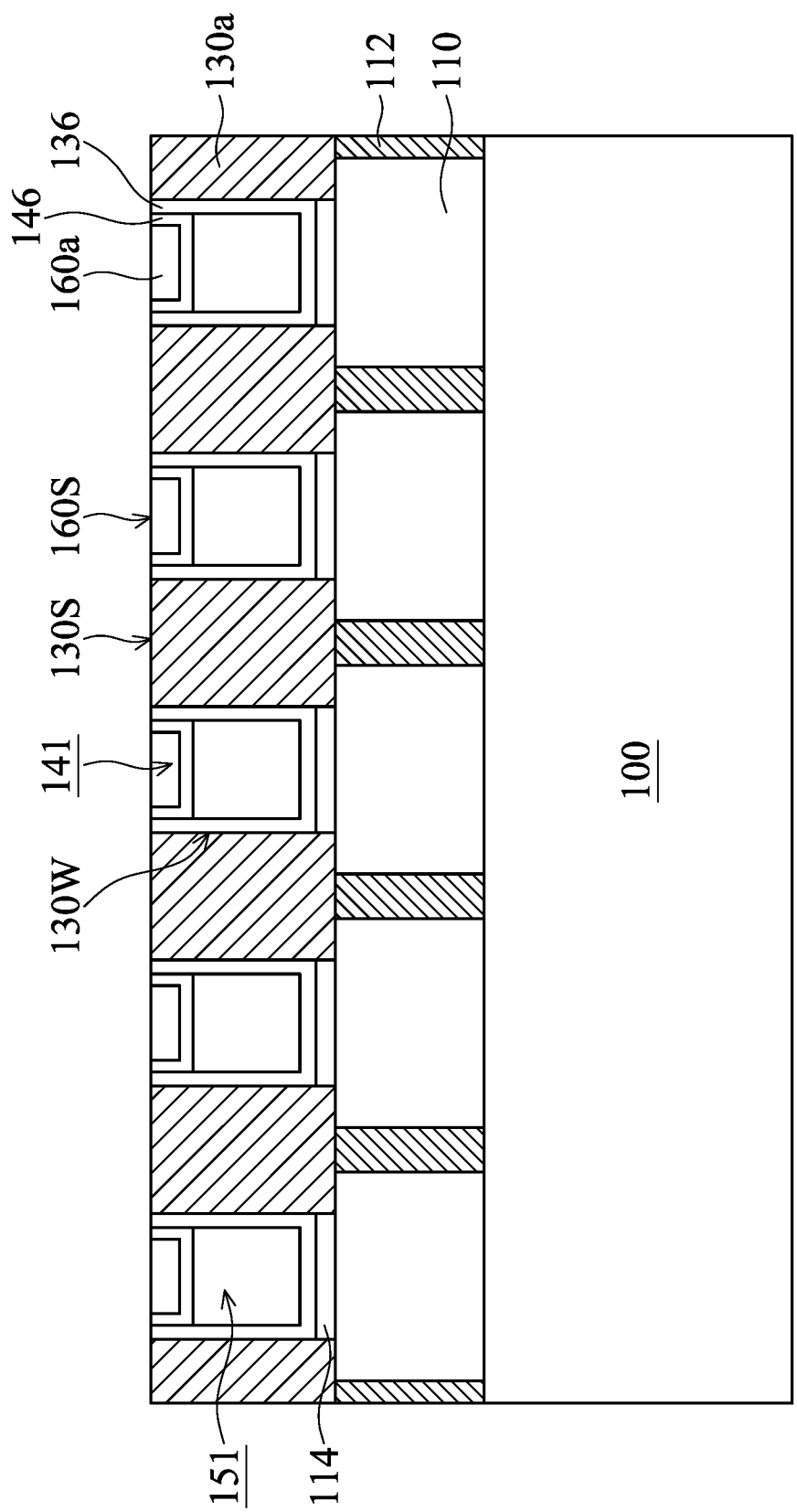

In operation 216 of the method 200, referring to FIGS. 1, 11 and 12, capping layers 160a are formed above and covering the corresponding air gaps 151, in accordance with some embodiments. More specifically, a damascene deposition process is performed to form an insulating material 160 in the third openings 141, as shown in FIG. 11 in accordance with some embodiments. The insulating material 160 may be additionally disposed above the conductive lines/layers 130a and fills the third openings 141. In some embodiments, the formed insulating material 160 is formed over the sidewalls and bottom of each third opening 141 having the second liner 146 therein. Moreover, the formed insulating material 160 is in direct contact with the second liner 146.

The insulating material 160 may be made of or include a dielectric material that is the same as or different from a dielectric material of the first layer 114 or a dielectric material of the third layer 118. For example, insulating material 160 may be made of or include SiC, $SiO_2$, SiN, SiCN, SiON, SiOC, SiOCN, or another suitable material. The insulating material 160 may be formed by a CVD process, an ALD process, a spin-on process, one or more other applicable processes, or a combination thereof.

In some embodiments, a planarization process (e.g., a CMP process, a dry polishing process, a grinding process, an etching process, one or more other applicable processes, or a combination thereof) is subsequently performed to remove the excess insulating material 160 and the first and second liners 136 and 146 above the conductive lines/layers 130a. As a result, the upper surfaces 130S of the conductive lines/layers 130a are exposed. The top of the remaining insulating material 160 is substantially level with the exposed upper surfaces 130S of the conductive lines/layers 130a, as shown in FIG. 12.

As a result of the damascene deposition process and the subsequent planarization process, the remaining insulating material 160 forms an insulating capping layer 160a in each of the third openings 141 to cover each of the air gaps 151. The upper surface 160S of the insulating capping layer 160a is substantially level with the exposed upper surfaces 130S of the conductive lines/layers 130a.

Moreover, the remaining first and second liners 136 and 146 in each of the third openings 141 surround and cover the sidewalls and bottom of the insulating capping layer 160a. As a result, the remaining second liner 146 is between each of the insulating capping layers 160a and the remaining first liner 136 that extends above the corresponding air gap 151.

Embodiments of a semiconductor device structure and a method of forming the same are provided. The formation of the semiconductor device structure includes forming metal lines/layers in a masking structure over a semiconductor substrate. Afterwards, the masking structure is recessed to form openings between the conductive lines/layers. Each of the openings is filled with a sacrificial layer and an overlying capping liner. Afterwards, the sacrificial layer is removed from each of those openings to form air gaps therefrom. Since the air gaps can be employed to replace a typical low-k dielectric layer used in the damascene process, there is no damaged low-k dielectric layer between the conductive lines/layers in the interconnect structure. As a result, the reliability of the interconnect structure can be effectively enhanced. Moreover, compared to the low-k dielectric layer, the air gap can provide a relatively lower dielectric constant for the interconnect structure. Therefore, such a semiconductor device structure with air gaps further reduces parasitic effects of line to line capacitance, thereby increasing device performance.

In some embodiments, a method of forming a semiconductor device structure is provided. The method includes forming a masking structure with first openings over a semiconductor substrate and correspondingly forming metal layers in the first openings. The method also includes recessing the masking structure to form second openings between the metal layers and forming a sacrificial layer surrounded by a first liner in each of the second openings. The method further includes forming a second liner over the sacrificial layer in each of the second openings and removing the sacrificial layer in each of the second openings to form a plurality of air gaps therefrom.

In some embodiments, a method of forming a semiconductor device structure is provided. The method includes forming an insulating layer over a semiconductor substrate and forming a conductive via in the insulating layer. The method also includes forming a masking structure over the insulating layer. The masking structure has a trench opening that exposes the conductive via and includes a first layer and a second layer formed over the first layer. The method further includes forming a conductive line in the trench opening to electrically connect the conductive via. In addition, the method includes removing the second layer from the masking structure and forming a thermal decomposable material in a space formed by the removal of the second layer. The upper surface of the thermal decomposable material is lower than the upper surface of the metal line. The method also includes forming a capping liner to cover the upper surfaces of the thermal decomposable material and the metal line. The method further includes removing the thermal decomposable material using a thermal process to form two air gaps adjacent to opposite sidewalls of the conductive line.

In some embodiments, a semiconductor device structure is provided. The semiconductor device structure includes a first insulating layer formed over a semiconductor substrate and conductive vias formed in the first insulating layer. The semiconductor device structure also includes conductive lines and air gaps alternately formed over the first insulating layer. The conductive lines are correspondingly aligned to the conductive vias. The semiconductor device structure further includes capping layers that correspondingly cover the air gaps.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device structure, comprising:
   forming a masking structure with a plurality of first openings over a semiconductor substrate;
   correspondingly forming a plurality of metal layers in the plurality of first openings;
   recessing the masking structure to form a plurality of second openings between the plurality of metal layers;
   forming a sacrificial layer surrounded by a first liner in each of the plurality of second openings;
   forming a second liner over the sacrificial layer in each of the plurality of second openings; and
   removing the sacrificial layer in each of the plurality of second openings to form a plurality of air gaps therefrom.

2. The method as claimed in claim 1, wherein the masking structure comprises:
   a first layer;
   a second layer formed over the first layer; and
   a third layer formed over the second layer,
   wherein an etching rate of the second layer is different than an etching rate of the first layer and an etching rate of the third layer.

3. The method as claimed in claim 2, wherein the first and third layers are made of different dielectric materials, and the second layer is made of a metal-containing material.

4. The method as claimed in claim 2, wherein the formation of the plurality of metal layers further comprises:
   forming a metal material over the third layer and in the plurality of first openings; and
   polishing the metal material and the underlying third layer to expose the second layer.

5. The method as claimed in claim 2, wherein the plurality of second openings expose the first layer.

6. The method as claimed in claim 1, further comprising:
   forming an insulating capping layer above each of the plurality of air gaps.

7. The method as claimed in claim 6, wherein the insulating capping layer is surrounded by the second liner.

8. The method as claimed in claim 1, wherein the sacrificial layer is made of a thermal decomposable material.

9. A method of forming a semiconductor device structure, comprising:
   forming an insulating layer over a semiconductor substrate;
   forming a conductive via in the insulating layer;
   forming a masking structure over the insulating layer, wherein the masking structure has a trench opening that exposes the conductive via and comprises:
   a first layer; and
   a second layer formed over the first layer;
   forming a conductive line in the trench opening to electrically connect the conductive via;
   removing the second layer from the masking structure;
   forming a thermal decomposable material in a space formed by the removal of the second layer, wherein an upper surface of the thermal decomposable material is lower than an upper surface of the metal line;
   forming a capping liner to cover the upper surfaces of the thermal decomposable material and the metal line; and
   removing the thermal decomposable material by a thermal process to form two air gaps adjacent to opposite sidewalls of the conductive line.

10. The method as claimed in claim 9, further comprising:
    forming a protective liner in the space prior to the formation of the thermal decomposable material, so that the thermal decomposable material is separated from the conductive line and the first layer by the protective liner.

11. The method as claimed in claim 10, wherein the capping liner is separated from the conductive line by the protective liner, and wherein the protective liner is made of an insulating material.

12. The method as claimed in claim 9, further comprising:
    forming an insulating capping layer above each of the two air gaps, wherein the capping liner covering the upper surface of the conductive line is removed after the formation of the insulating capping layer.

13. The method as claimed in claim 12, further comprising:
    forming a protective liner in the space prior to the formation of the capping liner, wherein the insulating capping layer is separated from the protective liner by the capping liner.

14. The method as claimed in claim 13, wherein the protective liner is made of an insulating material.

15. A method of forming a semiconductor device structure, comprising:
    forming two conductive lines over and electrically connected to two conductive vias, respectively, wherein the conductive vias is formed in an insulating layer below the conductive lines and over a semiconductor substrate;
    forming a sacrificial structure over the insulating layer and between the conductive lines, wherein the sacrificial structure comprising a sacrificial layer surrounded by a first liner layer and covered by a second liner layer; and
    removing the sacrificial layer to form an air gap surrounded by the first liner layer and covered by the second liner layer.

16. The method as claimed in claim 15, wherein the first liner is formed before forming the sacrificial layer, and wherein sidewalls and a bottom of the sacrificial layer is surrounded by the first liner layer.

17. The method as claimed in claim 16, further comprising:
    recessing the sacrificial layer before covering the sacrificial layer with the second liner layer, so that a recess is formed above the recessed sacrificial layer and surrounded by the second liner layer; and
    filling the recess with an insulating capping layer.

18. The method as claimed in claim 17, wherein the first liner layer extends above the recessed sacrificial layer and separated from the insulating capping layer by the second liner layer.

19. The method as claimed in claim 17, wherein an upper surface of the insulating capping layers is substantially level with an upper surface of the conductive lines.

20. The method as claimed in claim 15, wherein the sacrificial layer is made of a thermal decomposable material.

* * * * *